(12) United States Patent
Moon et al.

(10) Patent No.: US 8,536,557 B2
(45) Date of Patent: Sep. 17, 2013

(54) LIGHT EMITTING DEVICE AND LIGHT EMITTING DEVICE PACKAGE

(75) Inventors: Yong Tae Moon, Seoul (KR); Seoung Hwan Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/365,465

(22) Filed: Feb. 3, 2012

(65) Prior Publication Data

US 2012/0126202 A1    May 24, 2012

(30) Foreign Application Priority Data

Aug. 16, 2011  (KR) .......................... 10-2011-0081343

(51) Int. Cl.
*H01L 29/02*   (2006.01)

(52) U.S. Cl.
USPC ..... 257/4; 257/2; 257/3; 257/5; 257/E29.002; 438/102; 438/103; 438/104; 365/163

(58) Field of Classification Search
USPC .............................. 257/13, E33.008; 438/20
See application file for complete search history.

(56) References Cited

U.S. PATENT DOCUMENTS

| | | | | |
|---|---|---|---|---|
| 5,679,965 A | * | 10/1997 | Schetzina | ...................... 257/103 |
| 2009/0109151 A1 | * | 4/2009 | Kim et al. | ........................ 345/83 |

\* cited by examiner

*Primary Examiner* — Jami M Valentine
(74) *Attorney, Agent, or Firm* — KED & Associates, LLP

(57) ABSTRACT

Provided is a light emitting device, a method for manufacturing the light emitting device, a light emitting device package, and a lighting system. The light emitting device of the embodiment includes a first conductive semiconductor layer; a second conductive semiconductor layer; and a active layer including a quantum well and a quantum bather between the first conductive semiconductor layer and the second conductive semiconductor layer, wherein the energy band gap of the quantum well is gradually changed into parabolic toward a center of the quantum well.

17 Claims, 5 Drawing Sheets

LIGHT EMITTING DEVICE AND LIGHT EMITTING DEVICE PACKAGE

CROSS-REFERENCE TO RELATED APPLICATION

This application claims under 35 U.S.C. §119 to Korean Patent Application No. 10-2011-0081343, (filed Aug. 16, 2011), which is hereby incorporated by reference in its entirety.

TECHNICAL FIELD

Embodiments relate to a light emitting device, a method for manufacturing the light emitting device, a light emitting device package, and a lighting system.

DESCRIPTION OF THE RELATED ART

The light emitting device converts electrical energy into light energy, and for example, LEDs may implement various colors by controlling composition ratio of compound semiconductor.

The light emitting device in the related art includes a N-type GaN layer, a P-type GaN layer and a active layer therebetween, a InGaN quantum well and a GaN quantum barrier are repeatedly laminated in multi quantum wells (MQW) forming the active layer, electrons injected into the active layer through the N-type GaN layer, and holes injected into the active layer through the P-type GaN layer are combined in InGaN quantum well to generate light in combination with each other.

On the other hand, GaN and InN of nitride semiconductor material have the same crystallographic orientation on the heterogeneous bulk substrate, and the difference in lattice constant in surface direction thereof is very large as about 10% when growing as a thin film type. That is, the lattice constant in surface direction for InN is larger by about 10% than the lattice constant in surface direction for GaN.

The quantum well, in which GaN and InN are mixed for a fixed percentage, has the composition of InGaN wherein the lattice constant in the surface direction for InGaN quantum well is larger than that of GaN composing the quantum barrier. Therefore, the InGaN quantum well is heavily subjected to the compressive stress in the active layer of the InGaN quantum well/GaN quantum barrier structures on an N-type GaN substrate.

Heavy compressive stress acting on the InGaN quantum well generates large internal field, thereby to generate piezo electric field and to deform the energy band structure of the InGaN quantum well.

Therefore, the electrons and the holes in the quantum well of square-potential in the related art are spatially separated, such that the recombination coefficient is deteriorated. Therefore, there is a problem to cause quantum-confined stark effect (QCSE) significantly lowering spontaneous light flux.

SUMMARY OF THE DISCLOSURE

The embodiments provide a light emitting device having high coefficient, a method for manufacturing the light emitting device, a light emitting device package, and a lighting system.

In one embodiment, a light emitting device including a first conductive semiconductor layer; a second conductive semiconductor layer; and a active layer including a quantum well and a quantum bather between the first conductive semiconductor layer and the second conductive semiconductor layer, wherein the energy band gap of the quantum well is gradually changed into parabolic toward a center of the quantum well.

Further, according to another aspect of the embodiments, there is provided a light emitting device including a supporting substrate, and light emitting structures on the supporting substrate, wherein the light emitting structures includes the active layer including the quantum well and the quantum bather, the quantum well contains indium, and the composition of indium may be nonlinearly reduced, approaching toward the quantum barrier.

Further, the light emitting device package of the embodiment includes a package body; at least one electrode layer on the package body; a light emitting device electrically connected to the electrode layer; and a molding member on the light emitting device.

Further, a lighting system of the embodiment includes light emitting modules formed with a predetermined substrate and the light emitting device package on the substrate, and the light emitting device package includes a package body; at least one electrode layer disposed in the package body; a light emitting device electrically connected to the electrode layer; and a molding member surrounding the light emitting device.

DESCRIPTION OF THE PREFERRED EMBODIMENTS

Hereinafter, a light emitting device, a light emitting device package and a lighting system according to the embodiment will be described with reference to the attached drawings.

In the description of embodiments, it will be understood that when a layer (or film) is referred to as being 'on/above' another layer or substrate, it can be directly on/over another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiment

Figure 1:
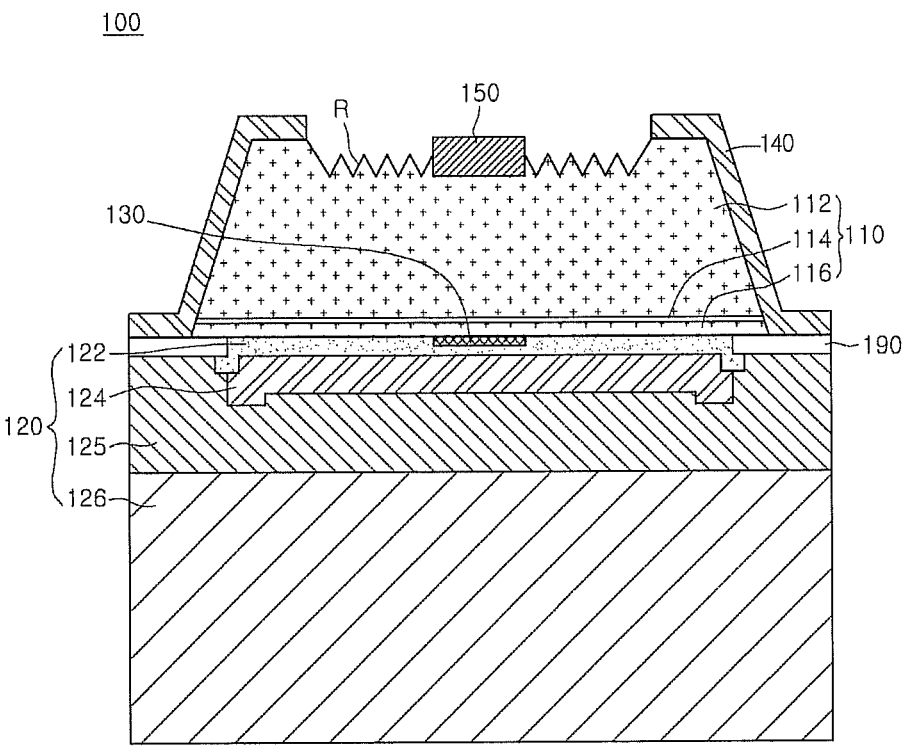
FIG. 1 is a sectional view of a light emitting device of an embodiment.
Figure 2:
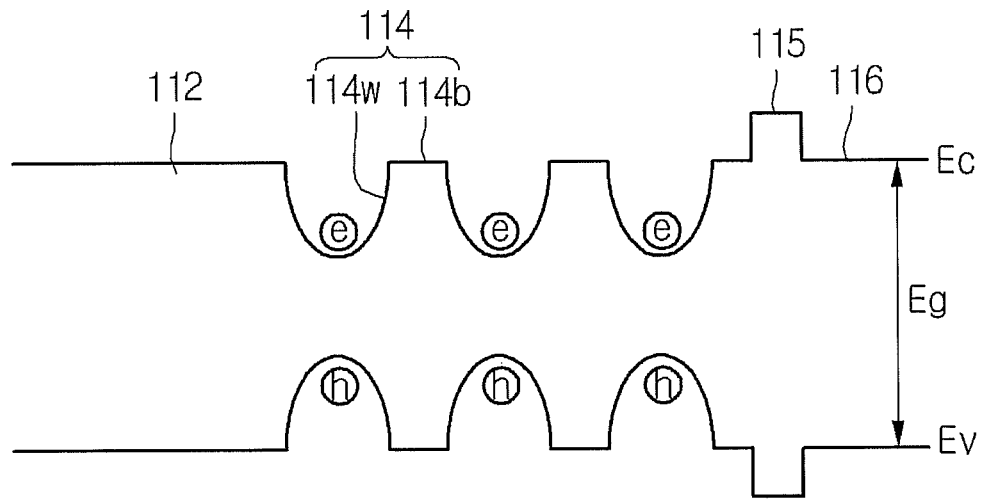
FIG. 2 shows an energy band diagram of the light emitting device according to the embodiment.

FIG. 1 is a sectional view of a light emitting device 100 of an embodiment, and FIG. 2 shows an energy band diagram of the light emitting device 100 according to the embodiment. FIG. 1 shows vertical light emitting device, but the embodiment is not limited thereto.

The light emitting device 100 according to the embodiment includes a first conductive semiconductor layer 112; a second conductive semiconductor layer 116; and an active layer 114 including a quantum well 114w and a quantum barrier 114b between the first conductive semiconductor layer 112 and the second conductive semiconductor layer 116, and the energy band gap of the quantum well 114w may be gradually changed.

Further, the light emitting device 100 of the embodiment includes a supporting substrate 126, and light emitting structures 110 on the supporting substrate 126, the light emitting structures 110 includes the active layer 114 including the quantum well 114w and the quantum barrier 114b, the quantum well 114w contains indium (In), and the composition of indium may be nonlinearly reduced, approaching toward quantum bather 114b. The supporting substrate 126 may be a second electrode layer 120, but is not limited thereto.

For example, the energy band gap of the quantum well 114w may be changed into parabolic toward a center of the quantum well.

Further, the quantum well 114w has a predetermined thickness, and a largest content of the indium may exist at a half of the predetermined thickness.

For example, when manufacturing the light emitting structures 110 having a wavelength of about 400-500 nm in the embodiment, the content of the indium of $In_xGa_{1-x}N$ x may become 0~ about 0.25 in a parabolic potential well structure. The quantum bather 114b may become GaN when content of the indium (In) x is 0%, the amount of In is gradually increased toward the middle of the quantum well 114w, and the content of the indium x may become about 0.25 in the middle. At this moment, a light emitting wavelength of the light emitting device 100 may be about 420 nm~450 nm, but is not limited thereto.

Further, the quantum well 114w and the quantum barrier 114b are repeatedly laminated in the active layer 114, the quantum well 114w includes the indium, and the composition of the indium may be nonlinearly increased and decreased repeatedly.

Further, when the light emitting device becomes the light emitting device for UV, the quantum well 114w and the quantum barrier 114b are repeatedly laminated in the active layer 114, the quantum well 114w includes aluminum (Al), and the composition of the aluminum may be nonlinearly increased and decreased repeatedly.

Further, in the energy band gap of the quantum well 114w, the energy band gap may be nonlinearly reduced, approaching toward the center of the quantum well 114w.

The first conductive semiconductor layer 112, the active layer 114, and the second conductive semiconductor layer 116 may form the light emitting structures 110 in the embodiment, and a passivation layer 140 formed in a part of top surface of the light emitting structures 110 and a side surface of the light emitting structures 110, and a first electrode 150 on the light emitting structures 110 may be included in the embodiment.

Hereinafter, the entire structure of the light emitting device 100 will be described according to the embodiment with reference to FIG. 1, and the energy band structure of the activate layer for the light emitting device will be described according to the embodiment with reference to FIG. 2.

The first conductive semiconductor layer 112 may contain a semiconductor material having an empirical formula of $In_xAl_yGa_{1-x-y}N$ ($0 \leq x \leq 1$, $0 \leq y \leq 1$, $0 \leq x+y \leq 1$). For example, the first conductive semiconductor layer 112 may be formed by at least any one of GaN, InN, AlN, InGaN, AlGaN, InAlGaN, AlInN, AlGaAs, InGaAs, AlInGaAs, GaP, AlGaP, InGaP, AlInGaP, InP.

The active layer 114 may be formed by at least any one of a single quantum well structure, multi quantum well structures, a quantum-wire structure, or a quantum dot structure.

The active layer 114 may include the quantum well 114w and the quantum barrier 114b, and the quantum well 114w, and the quantum barrier 114b may compose the empirical formula of $In_xGa_{1-x}N/Ga_{1-x}N/GaN$ (0<x<1), but is not limited thereto. For example, the active layer 114 may be formed by at least one pair structure of InGaN/GaN, InGaN/InGaN, GaN/AlGaN, InAlGaN/GaN, GaN/InAlGaN, GaAs(InGaAs)/AlGaAs, GaP(InGaP)/AlGaP, but is not limited thereto. The quantum well may be formed by a material having the energy band gap smaller than that of the quantum barrier.

In the embodiment, an electron blocking layer 115 (refer to FIG. 2) is formed on the active layer 114 and may improve light emitting coefficient by performing an electron blocking function and by acting as cladding (MQW cladding) of the active layer. The electron blocking layer 115 may have the energy band gap larger than that of the active layer 114. For example, the electron blocking layer 115 may contain aluminum (Al). That is, the electron blocking layer 115 may be formed by $Al_xIn_yGa_{(1-x-y)}N$ ($0 \leq x \leq 1, 0 \leq y \leq 1$)-base semiconductor, but is not limited thereto. The electron blocking layer 115 may formed by the thickness of about 100 Å~600 Å, but is not limited thereto.

Further, the electron blocking layer 115 may be formed by $Al_zGa_{(1-z)}N/GaN$ ($0 \leq z \leq 1$) superlattice, and is not limited thereto.

The electron blocking layer 115 efficiently blocks the electrons which are not recombined in the active layer 114 and are overflowed into a p-type semiconductor layer, and may increase injecting coefficient of holes. Further, the electron blocking layer 115 may be doped with p-type or n-type impurities. For example, Mg in the concentration range of about $10^{18}$~$10^{20}$/cm$^3$ is doped into the electron blocking layer 115 by using an ion injection scheme etc., and therefore, the electron blocking layer 115 efficiently blocks the overflowed electrons, thereby to increase the injection coefficient of the holes.

The second conductive semiconductor layer 116 may contain a compound semiconductor material of group 3-5 element doped with second conductive dopant, for example, the semiconductor material having the empirical formula of $In_xAl_yGa_{1-x-y}N$ ($0 \leq x \leq 1$, $0 \leq y \leq 1$, $0 \leq x+y \leq 1$). The second conductive semiconductor layer 116 may be selected from, for example, GaN, AlN, AlGaN, InGaN, InN, InAlGaN, AlInN, AlGaAs, GaP, GaAs, GaAsP, AlGaInP etc.

In the embodiment, the first conductive semiconductor layer 112 may be doped with an n-type semiconductor layer, and the second conductive semiconductor layer 116 may be doped with a p-type semiconductor layer, but is not limited thereto. The semiconductor having polarity opposite to the second conductive type, that is, the n-type semiconductor layer (not shown) may be further formed on the second conductive semiconductor layer 116, for example, when the second conductive semiconductor layer 116 is the p-type semiconductor layer. Therefore, the light emitting structures 110 may be doped with any one of n-p junction structure, p-n junction structure, n-p-n junction structure, and p-n-p junction structure.

The top surface of the light emitting structures 110 is formed with concavo-convex R to increase lighting extraction coefficient.

A bottom side of the light emitting structures 110 is formed with the second electrode layer 120, and the second electrode layer 120 may include an ohmic layer 122, a reflection layer 124, a bonding layer 125, a supporting substrate 126 etc.

The ohmic layer 122 may be formed by the material having excellent electrical contact with the semiconductor. For example, the ohmic layer 122 may contain at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, Hf, and is not limited to these materials.

Further, the reflection layer 124 may have excellent reflexibility, and may be formed by the material having excellent electrical contact. For example, the reflection layer 124 may be formed by the metal including at least one of Ag, Ni, Al, Rh, Pd, Ir, Ru, Mg, Zn, Pt, Au, and Hf or their alloy. Further, the reflection layer 124 may be formed by multi-layers using the metal or their alloy and a transparent conductive material such as TZO, IZTO, IAZO, IGZO, IGTO, AZO, ATO etc. and may be laminated with IZO/Ni, AZO/Ag, IZO/Ag/Ni, AZO/Ag/Ni etc.

Further, the bonding layer 125 may be formed by the material having an excellent bonding force. For example, the bonding layer 125 may contain at least one of Ti, Au, Sn, Ni, Cr, Ga, In, Bi, Cu, Ag or Ta.

Further, the supporting substrate 126 may be formed by the metal or semiconductor material etc. Further, the supporting substrate 126 may be formed by an electrical conductivity and a thermal conductivity. For example, the supporting substrate 126 may contain at least one of copper (Cu), copper alloy (Cu Alloy), gold (Au), nickel (Ni), molybden (Mo), copper-tungsten (Cu—W), carrier wafer (for example, Si, Ge, GaAs, GaN, ZnO, SiGe, SiC etc.)

A protection member 190 may be formed outside the bottom of the light emitting structures 110, and a current blocking layer (CBL) 130 may be formed between the light emitting structures 110 and the ohmic layer 130.

The protection member 190 may be formed in a circumference domain between the light emitting structures 110 and the bonding layer 125, and may be formed in a ring shape, a loop shape, and a square frame shape. The portion of the protection member 190 may be overlapped in the vertical direction to the light emitting structures 110.

The protection member 190 may increase a distance from the side between the bonding layer 125 and the active layer 114, thereby reducing the occurring possibility of an electrical short between the bonding layer 125 and the active layer 114 and preventing the electrical short in an on-chip separation process.

The protection member 190 may be formed using the material having electric insulation, or the material having electrical conductivity lower than that of the reflection layer 124 or the bonding layer 125, or the material forming a schottky contact with the second conductive semiconductor layer 116. For example, the protection member 190 may contain at least one of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, $TiO_2$, Ti, Al or Cr.

Hereinafter, an energy band diagram for the light emitting device according to the embodiment will be described with reference to FIG. 2.

In the embodiment, spatial separation of the electrons and the holes in the active layer is efficiently reduced by internal field present in the active layer, thereby to improve spontaneous light emitting coefficient of the quantum well to provide the light emitting device having high coefficient.

To this end, the light emitting device 100 according to the embodiment includes a first conductive semiconductor layer 112; a second conductive semiconductor layer 116; and a active layer 114 including a quantum well 114w and a quantum barrier 114b between the first conductive semiconductor layer 112 and the second conductive semiconductor layer 116, and the energy band gap of the quantum well may be gradually changed.

For example, in the embodiment, the active layer 114 of the multi quantum well structure is provided between a n-type semiconductor 112 for electrons injection and a p-type semiconductor 116 for holes injection, and the active layer 114 may include the quantum well having gradually changing the energy band gap.

For example, in the embodiment, the quantum well 114w to allow energy band gap to gradually change may be changed into the energy band gap having parabolic toward the center of the quantum well.

Therefore, in the embodiment, the energy band gap is gradually reduced toward the center of the quantum well 114w, and then, the energy band gap is gradually increased, being far away from the center.

In the embodiment, the quantum well 114w contains $In_xGa_{1-x}N$ (0<x<1), the composition of the indium (In) x is increased toward the center of the quantum well 114w, and may be reduced, being far away from the center of the quantum well 114w.

In the embodiment, the quantum well structure of the quantum well 114w may include a non square-potential well structure.

For example, the energy band gap of the quantum well having parabolic may be gradually reduced toward the center of the quantum well.

In the embodiment, the composition of In is gradually increased toward the center of the quantum well in the $In_xGa_{1-x}$ N quantum well 114w, and the energy band gap having parabolic may be reduced toward the center of the quantum well, but is not limited thereto.

In the embodiment, the composition of In is gradually increased toward the center of the quantum well, thereby gradually buffering the compressive stress exerted on the quantum well by lattice mismatch between GaN quantum barrier 114b and $In_xGa_{1-x}N$ quantum well to reduce the internal field.

Further, in the embodiment, the energy band gap is reduced toward the center of the quantum well, and therefore, the electrons and the holes injected into the quantum well are positioned around the center of the quantum well having the lowest energy state in quantum mechanics.

Therefore, in the embodiment, in the case of the parabolic potential well structure, the degree of the spatial separation for the electrons and the holes in the quantum well is significantly reduced according to the energy band structure deformation of the quantum well by the internal field acting on $In_xGa_{1-x}N$ quantum well.

As a result, in wave functions of the electrons and the holes, the probability of recombination to each other is increased, thereby increasing the spontaneous emitting coefficient of the light emitting device.

In the embodiment, the spatial separation of the electrons and the holes in the active layer is efficiently reduced by the internal field present in the active layer, thereby to improve spontaneous light emitting coefficient of the quantum well to provide the light emitting device having high coefficient, a method for manufacturing the light emitting device, the light emitting device package and a lighting system.

For example, when manufacturing the light emitting structures having a wavelength of about 400~500 nm in the embodiment, the content of the indium of $In_xGa_{1-x}N$ x may become 0~ about 0.25 in a parabolic potential well structure. The quantum barrier 114b may become GaN when content of the indium (In) is about 0%, the amount of the In is gradually increased toward the middle of the quantum well 114w, and the content of the indium may become about 25% in the middle. At this moment, a light emitting wavelength of the light emitting device 100 may be about 420~450 nm, but is not limited thereto.

Figure 3:
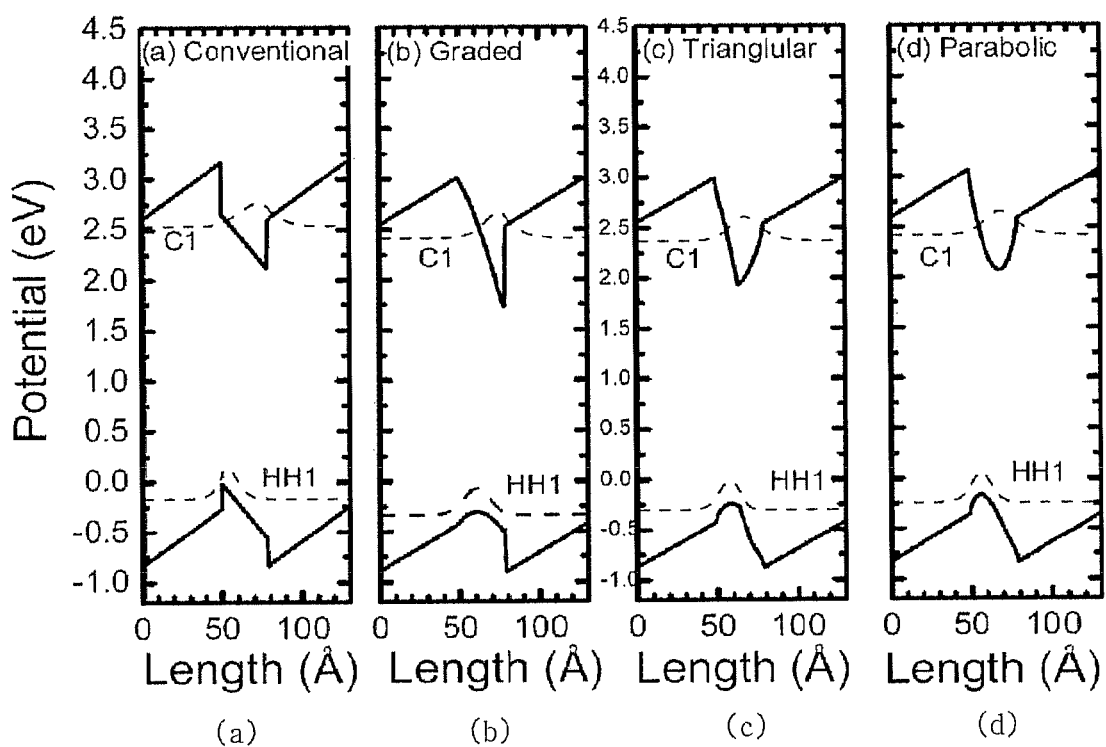
FIG. 3 shows a potential profile and a wave function distribution of the light emitting device according to a related art and the present embodiment.

FIG. 3 shows a potential profile and a wave function distribution of the light emitting device according to the related art and the present embodiment.

FIG. 3A to 3C show the quantum well structures in the related art.

For example, FIG. 3A shows a square-potential well structure, FIG. 3B shows a linearly graded asymmetric quantum well structure, and FIG. 3C shows a triangular quantum well structure.

FIG. 3D shows a parabolic potential well structure minimizing the spatial separation for the wave function of the electrons and the holes in the light emitting device of the embodiment.

In detail, FIG. 3A to 3D are distribution views of potential profiles and the electrons/holes wave functions for a subband C1 of a first conduction band and a subband Mil of a first valence band in each of the quantum well structures.

FIG. 3A shows the deformation of the energy band structure by the internal field essentially present in the active layer including InGaN quantum well and GaN quantum barrier. The electrons and the holes bound to the quantum well are spatially separated by the deformation of the energy band structure by the internal field, thereby to lower the probability to create light emitting recombining to each other.

Although in the related art, there are technologies for improving the quantum well structure as shown in FIGS. 3B and 3C, but the effect is negligible.

The parabolic potential well structure of the embodiment shows that the electrons and the holes are spatially separated to a minimum in the quantum well.

In the embodiment, the composition of In is gradually increased toward the center of the quantum well, thereby gradually buffering the compressive stress exerted on the quantum well by lattice mismatch between GaN quantum bather 114b and $In_xGa_{1-x}N$ quantum well to reduce the internal field.

Further, in the embodiment, the energy band gap is reduced toward the center of the quantum well, and therefore, the electrons and the holes injected into the quantum well are positioned around the center of the quantum well having the lowest energy state in quantum mechanics.

Therefore, in the embodiment, in the case of the parabolic potential well structure, the degree of the spatial separation for the electrons and the holes in the quantum well is significantly reduced according to the energy band structure deformation of the quantum well by the internal field acting on $In_xGa_{1-x}N$ quantum well.

As a result, in wave functions of the electron and the hole, the probability of recombination to each other is increased, thereby increasing the spontaneous emitting coefficient of the light emitting device.

In the embodiment, quantum-confined Stark effect (QCSE) is removed, and therefore, an overlap rate between the wave functions of the electron and the hole is widen, thereby improving radiative recombination rate to increase internal light emitting coefficient.

In the embodiment, spatial separation of electrons and holes in the active layer is efficiently reduced by internal field present in the active layer, thereby to improve spontaneous light emitting coefficient of the quantum well to provide the light emitting device having high coefficient, a method for manufacturing the light emitting device, the light emitting device package and a lighting system.

FIG. 4A to 4D show a spontaneous light flux in the light emitting device according to the related art and the present embodiment.

Figure 4:
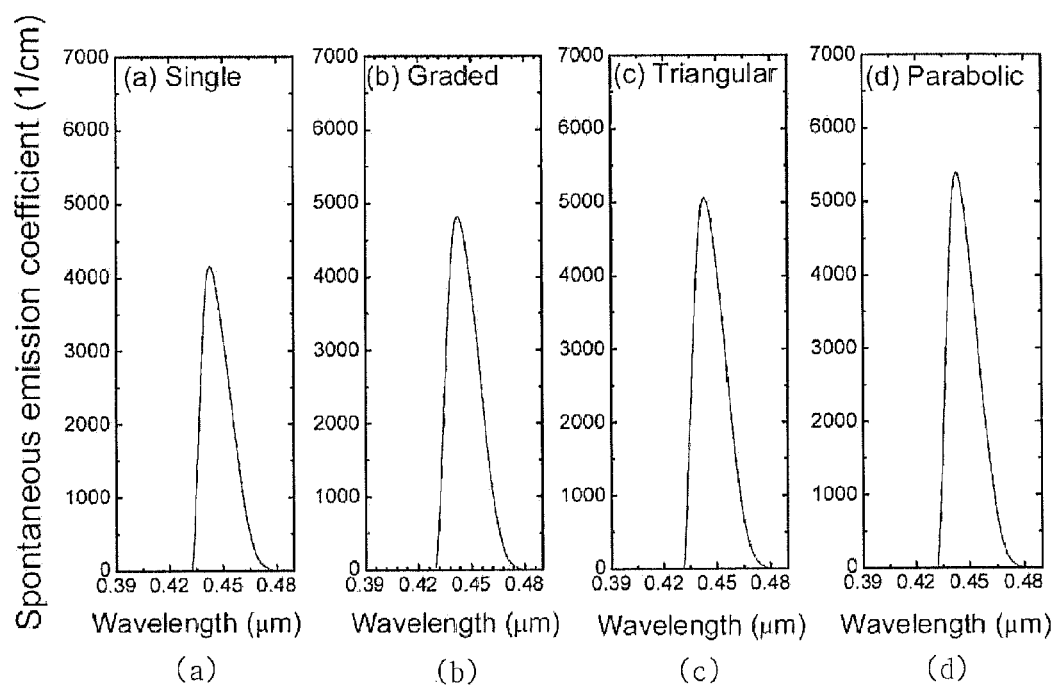
FIG. 4 shows spontaneous light flux in the light emitting device according to the related art and the present embodiment.

FIG. 4A to 4C illustrate the spontaneous light flux of the quantum well structure in the related art.

For example, FIG. 4A shows a square-potential well structure, FIG. 4B shows linearly graded asymmetric quantum well structure, and FIG. 4C shows triangular quantum well structure.

FIG. 4D illustrate the spontaneous light flux of the parabolic potential well structure minimizing the spatial separation for the wave function of the electron and the hole in the light emitting device of the embodiment.

FIG. 4A to 4D show that the spontaneous light emitting coefficient of the light emitting device applying the parabolic potential well structure of the embodiment has the most outstanding characteristics.

In the embodiment, the composition of In is gradually increased toward the center of the quantum well, thereby gradually buffering the compressive stress exerted on the quantum well by lattice mismatch between the quantum barrier and the quantum well to reduce the internal field.

Further, in the embodiment, the energy band gap is reduced toward the center of the quantum well, and therefore, the electrons and the holes injected into the quantum well are positioned around the center of the quantum well having the lowest energy state in quantum mechanics.

Therefore, in the embodiment, in the case of the parabolic potential well structure, the degree of the spatial separation for the electrons and the holes in the quantum well is significantly reduced according to the energy band structure deformation of the quantum well by the internal field acting on the quantum well.

As a result, in wave functions of the electrons and the holes, the probability to be bonded to each other is increased, thereby increasing the spontaneous emitting coefficient of the light emitting device.

In the light emitting device, spontaneous emission spectrum values ($g_{sp}(w)$) and dielectric constant ($\in$) may be represented in inverse proportion to each other, and the smaller the dielectric constant of the quantum well, the higher the spontaneous emission coefficient.

The composition ratio of the indium (In) for the parabolic potential well structure of the embodiment may become small as compared with the linearly graded asymmetric quantum well structure or the triangular quantum well structure in the related art, and therefore, the dielectric constant becomes small, thereby increasing the spontaneous emission coefficient.

In the embodiment, quantum-confined Stark effect (QCSE) is removed, and therefore, the overlap rate between the wave functions of the electron and the hole is widen, thereby improving the radiative recombination rate to increase internal light emitting coefficient.

In the embodiment, spatial separation of electrons and holes in the active layer is efficiently reduced by internal field present in the active layer, thereby to improve spontaneous lighting emission coefficient of the quantum well to provide the light emitting device having high coefficient, a method for manufacturing the light emitting device, the light emitting device package and a lighting system.

Figure 5:
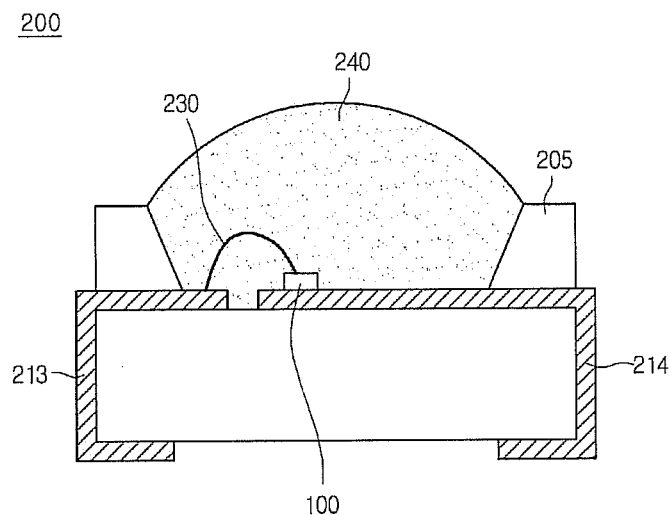
FIG. 5 is a sectional view of the light emitting device package of an embodiment.

FIG. 5 is a sectional view of a light emitting device package 200 of an embodiment.

In FIG. 5, the light emitting device package 200 includes a package body 205, a third electrode layer 213 and a fourth electrode layer 214 disposed in the package body 205, a light emitting device 100 disposed in the package body 205 and electrically connected to the third electrode layer 213 and a fourth electrode layer 214, and a molding member 240 surrounding the light emitting device 100.

The package body 205 may contain silicon material, synthetic resin material or metal material, and an incline may be formed around the light emitting device 100.

The third electrode layer 213 and the fourth electrode layer 214 may be electrically separated from each other, and supply power to the light emitting device 110. Further, the third electrode layer 213 and the fourth electrode layer 214 may increase the light coefficient by reflecting the light generated from the light emitting device 110, and may discharge heat generated from the light emitting device 110.

The vertical light emitting device 100 shown in FIG. 1 may be applied to the light emitting device 100, but is not limited thereto.

The light emitting device 100 may be disposed in the package body 205, or the third electrode layer 213 or the fourth electrode layer 214.

The light emitting device 100 may be electrically connected to the third electrode layer 213 and/or the fourth electrode layer 214 by any one of a wire type, a flip chip type or a die bonding type. In the embodiment, the light emitting device 100 is electrically connected to the third electrode layer 213 through the wire 230, and is electrically connected to the fourth electrode layer 214 by directly contacting the fourth electrode layer 214.

The molding member 240 may protect the light emitting device 100 by surrounding the light emitting device 100. Further, molding member 240 including fluorescent body may change wavelength of the light emitted from the light emitting device 100.

In the embodiment, spatial separation of electrons and holes in the active layer is efficiently reduced by internal field present in the active layer, thereby to improve spontaneous light emission coefficient of the quantum well to provide the light emitting device having high coefficient, a method for manufacturing the light emitting device, the light emitting device package and a lighting system.

A plurality of the light emitting device packages of the embodiment are arrayed on the substrate, and optical members, that is, a light guide, a prism sheet, a diffusion sheet and a fluorescent sheet etc. may be arranged on the path of the light emitted from the light emitting device package. The light emitting device package, a substrate, the optical member may function as a backlight unit or a lighting unit, and for example, the lighting system may include the backlight unit, the lighting unit, an indicating device, a lamp, streetlamp etc.

Figure 6:
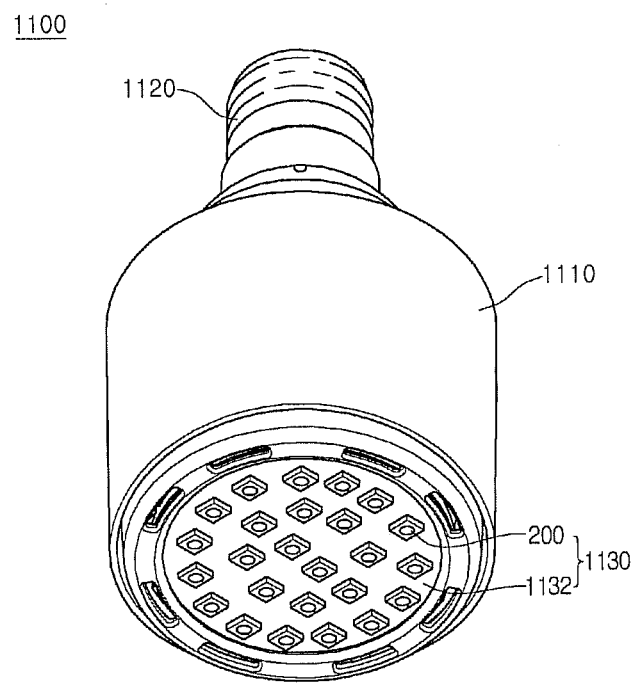
FIG. 6 is a prospective view of a lighting unit of the embodiment.

FIG. 6 is a prospective view of a lighting unit 1100 of the embodiment.

In FIG. 6, the lighting unit 1100 may include a case body 1110, light emitting modules 1130 disposed in the case body 1110, and a connecting terminal 1120 disposed in the case body 1110 and receiving power from external power source It is preferable to form the case body 1110 by the material having an excellent protection against heat characteristics, and the excellent material is, for example, the metal material or the resin material.

The light emitting modules 1130 may include a substrate 1132, and at least one light emitting device package 200 mounted in the substrate 1132.

The substrate 1132, in which circuit pattern is printed on an insulator, may include for example, printed circuit board (PCB), metal core PCB, flexible PCB, ceramic PCB etc.

Further, the substrate 1132 may be formed by the material efficiently reflecting the light, and may be formed by colors, for example, white, silver, etc. efficiently reflecting the light on the surface.

The at least one light emitting device package 200 may be mounted on the substrate 1132. Each of the light emitting device packages 200 may include at least one light emitting diode (LED) 100. The light emitting diode 100 may include colored light emitting diodes for light-emitting colored lights, respectively, such as red, green, blue or white, and UV light emitting diodes light-emitting ultraviolet (UV).

The light emitting modules 1130 may be arranged to have combinations of various light emitting device package 200 to obtain colors and brightness. For example, to secure high color rendition (CRI), it is possible to arrange the combined white light emitting diodes, red light emitting diodes, and green light emitting diodes.

The connecting terminal 1120 may be electrically connected to the light emitting modules 1130 to supply the power. In FIG. 6, the connecting terminal 1120 may be turned by a socket scheme so as to be inserted into the external power source, but is not limited thereto. For example, the connecting terminal 1120 may be formed by a pin type, and therefore, is inserted into the external power source, or may be connected to the external power source by wiring.

Figure 7:
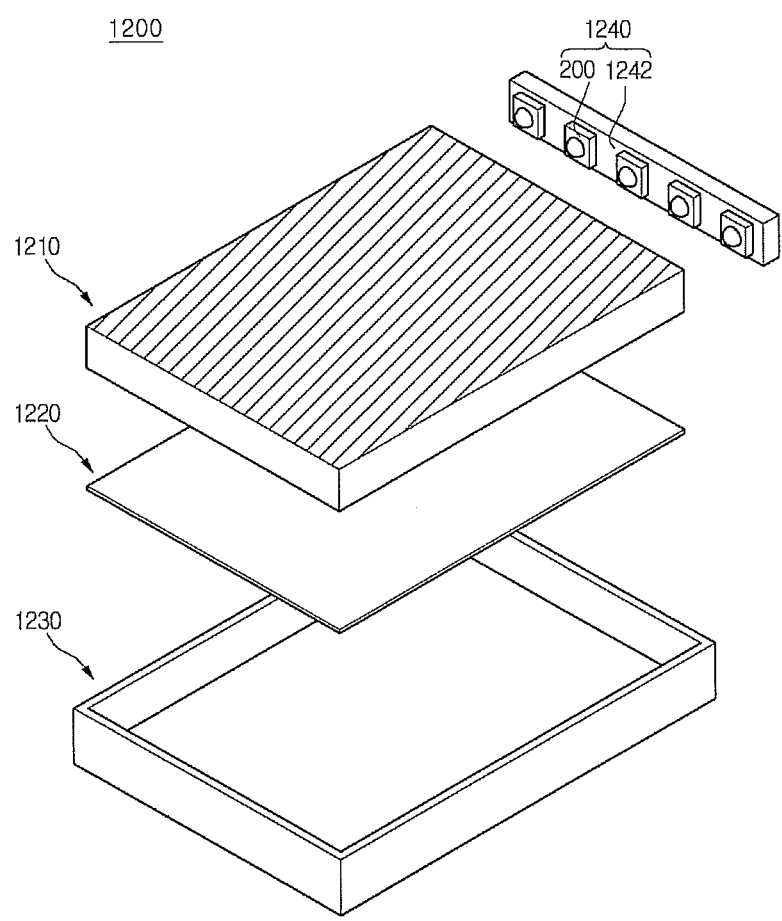
FIG. 7 is a disassembled prospective view of a backlight unit of the embodiment.

FIG. 7 is a disassembled prospective view of a backlight unit 1200 of the embodiment.

The backlight unit 1200 of the embodiment includes a light guide 1210, light emitting modules 1240 supplying the light to the light guide 1210, a reflection member 1220 below the light guide 1210, and a bottom cover 1230 accommodating the light guide 1210, the light emitting modules 1240 and the reflection member 1220, but is not limited thereto.

The light guide 1210 spreads the light to perform surface light source conversion. The light guide 1210 is formed by transparent material, and may contain, for example, one of acrylic resin such as polymethyl metaacrylate (PMMA), polyethylene terephthlate (PET), poly carbonate (PC), cycloolefin copolymer (COC) and polyethylene naphthalate (PEN) resin.

The light emitting modules 1240 provides the light to at least one side of the light guide 1210, and ultimately acts as light source of a display apparatus in which the backlight unit is disposed.

The light emitting modules 1240 may contact the light guide 1210, but is not limited thereto. In detail, the light emitting modules 1240 include a substrate 1242, and a plurality of light emitting device package 200 mounted in the substrate 1242 wherein the substrate 1242 may contact the light guide 1210, but is not limited thereto.

The substrate 1242 may be printed circuit board (PCB) including the circuit pattern (not shown). However, the substrate 1242 may include PCB, Metal Core PCB (MCPCB), flexible PCB (FPCB) etc., but is not limited thereto.

Further, in the plurality of light emitting device package 200, light emitting surface in which the light is emitted on the substrate 1242 may be mounted to be spaced at a predetermined distance from the light guide 1210.

The reflection member 1220 may be formed below the light guide 1210. The reflection member 1220 may improve the brightness of the backlight unit by reflecting the light incident on the bottom of the light guide 1210 and facing the reflected light upwards. The reflection member 1220 may be formed by, for example, PET, PC, PVC resin, etc., but is not limited thereto.

The bottom cover 1230 may accommodate the light guide 1210, the light emitting module 1240 and the reflection member 1220 etc. To this end, the top surface of the bottom cover 1230 may be formed by opened box shape, but is not limited thereto.

The bottom cover 1230 may be formed by the metal material or the resin material, and may be manufactured by the processes such as press molding or extrusion molding etc.

In the embodiment, spatial separation of electrons and holes in the active layer is efficiently reduced by internal field present in the active layer, thereby to improve spontaneous lighting emission coefficient of the quantum well to provide the light emitting device having high coefficient, a method for manufacturing the light emitting device, the light emitting device package and a lighting system.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a first conductive semiconductor layer;
a second conductive semiconductor layer; and
an active layer including a quantum well and a quantum barrier between the first conductive semiconductor layer and the second conductive semiconductor layer,
wherein an energy band gap of the quantum well is gradually changed into parabolic toward a center of the quantum well,
wherein the quantum well contains $In_xGa_{1-x}N(0<x<1)$, a composition of the indium (In) x is increased toward the center of the quantum well, and the composition of the indium (In)x is reduced, being far away from the center of the quantum well.

2. The light emitting device according to claim 1, wherein the energy band gap of the quantum well is gradually reduced toward the center of the quantum well, and the energy band gap is gradually increased, being far away from the center.

3. A light emitting device, comprising:
a first conductive semiconductor layer;
a second conductive semiconductor layer; and
an active layer including a quantum well and a quantum barrier between the first conductive semiconductor layer and the second conductive semiconductor layer,
wherein an energy band gap of the quantum well is gradually changed into parabolic toward a center of the quantum well,
wherein the energy band gap of the quantum well is gradually reduced toward the center of the quantum well, and the energy band gap is gradually increased, being far away from the center,
wherein the quantum well contains $In_xGa_{1-x}N(0<x<1)$,
wherein the quantum well has a predetermined thickness, and a largest content of the indium exists at a half of the predetermined thickness.

4. The light emitting device according to claim 2, wherein the composition of the indium(In) x is 0 to 0.25.

5. The light emitting device according to claim 4, wherein a light emitting wavelength of the active layer is about 400 nm~500 nm, and the composition of the indium(In) x for the center of the quantum well is about 0.25.

6. The light emitting device according to claim 1, wherein the quantum well and the quantum barrier are repeatedly laminated in the active layer, the quantum well includes the indium, and the composition of the indium is nonlinearly increased and decreased repeatedly.

7. The light emitting device according to claim 1, wherein the quantum well and the quantum barrier are repeatedly laminated in the active layer, the quantum well includes aluminum, and the composition of the aluminum is nonlinearly increased and decreased repeatedly.

8. The light emitting device according to claim 1, wherein the energy band gap of the quantum well is gradually reduced, approaching toward the center of the quantum well.

9. A light emitting device package, comprising:
a package body;
at least one electrode layer on the package body;
a light emitting device electrically connected to the electrode layer; and
a molding member on the light emitting device,
wherein the light emitting device includes:
a first conductive semiconductor layer,
a second conductive semiconductor layer, and
an active layer including a quantum well and a quantum barrier between the first conductive semiconductor layer and the second conductive semiconductor layer,
wherein an energy band gap of the quantum well is gradually changed into parabolic toward a center of the quantum well,
wherein the quantum well contains $In_xGa_{1-x}N(0<x<1)$, a composition of the indium(In) x is increased toward the center of the quantum well, and the composition of the indium (In)x is reduced, being far away from the center of the quantum well.

10. The light emitting device package according to claim 9, wherein the energy band gap of the quantum well is gradually reduced toward the center of the quantum well, and the energy band gap is gradually increased, being far away from the center.

11. The light emitting device package according to claim 3, wherein a composition of the indium(In) x is increased toward the center of the quantum well, and the composition of the indium (In)x is reduced, being far away from the center of the quantum well.

12. The light emitting device according to claim 3, wherein a composition of the indium(In) x is gradually increased toward the center of the quantum well, and the composition of the indium (In)x is gradually reduced, being far away from the center of the quantum well.

13. The light emitting device according to claim 1, wherein the composition of the indium(In) x is parabolically increased toward the center of the quantum well, and the composition of the indium (In)x is parabolically reduced, being far away from the center of the quantum well.

14. The light emitting device package according to claim 9, wherein the composition of the indium(In) x is gradually increased toward the center of the quantum well, and the composition of the indium (In)x is gradually reduced, being far away from the center of the quantum well.

15. The light emitting device package according to claim 9, wherein the composition of the indium(In) x is parabolically increased toward the center of the quantum well, and the composition of the indium (In)x is parabolically reduced, being far away from the center of the quantum well.

16. The light emitting device according to claim 1, wherein the quantum well contains $In_xGa_{1-x}N(0<x<1)$, and wherein the quantum well has a predetermined thickness, and a largest content of the indium exists at a half of the predetermined thickness.

17. The light emitting device according to claim 9, wherein the quantum well has a predetermined thickness, and a largest content of the indium exists at a half of the predetermined thickness.

* * * * *